United States Patent [19]

Pougnet

[11] Patent Number: 4,507,754
[45] Date of Patent: Mar. 26, 1985

[54] MAGNETIC BUBBLE PROPAGATION DEVICE

[75] Inventor: Philippe Pougnet, Plaisir, France

[73] Assignee: Commissariat a L'Energie Atomique, Paris, France

[21] Appl. No.: 614,442

[22] Filed: May 25, 1984

[30] Foreign Application Priority Data

May 30, 1983 [FR] France .................. 83 08913

[51] Int. Cl.$^3$ .............................................. G11C 19/08
[52] U.S. Cl. ......................................... 365/19; 365/36
[58] Field of Search ...................... 365/36, 19, 20, 21

[56] References Cited

U.S. PATENT DOCUMENTS

| | | | |
|---|---|---|---|
| 4,023,150 | 5/1977 | Voegeli | 365/20 |
| 4,143,419 | 3/1979 | Bobeck | 365/36 |
| 4,143,420 | 3/1979 | Bobeck | 365/36 |
| 4,162,537 | 7/1979 | Bobeck | 365/19 |
| 4,181,979 | 1/1980 | Bobeck | 365/36 |

FOREIGN PATENT DOCUMENTS 0038754 10/1981 European Pat. Off. ............. 365/19

*Primary Examiner*—James W. Moffitt
*Attorney, Agent, or Firm*—Michael N. Meller

[57] ABSTRACT

This device comprises an ionically implanted magnetic garnet layer, in which are defined non-implanted patterns and an electrically conductive layer superimposed on the garnet layer and insulated therefrom. The patterns are islands which are separated from one another. The electrically conductive layer has a first conductive coating having windows parallel to the first direction for respectively displacing the bubbles located between the patterns of the first pairs of patterns arranged parallel to a first direction, by a pulse-type current parallel to a first direction. The electrically conductive layer also has a second conductive coating superimposed on the first conductive coating and insulated therefrom and which has windows parallel to a second direction in order to respectively displace the bubbles between the patterns of the second pairs of patterns arranged parallel to a second direction, by a pulse-type current parallel to a second direction. Each first pair of patterns has a common pattern with each second pair of patterns.

4 Claims, 9 Drawing Figures

MAGNETIC BUBBLE PROPAGATION DEVICE

BACKGROUND OF THE INVENTION

The present invention relates to a magnetic bubble propagation device. It is applicable to the circulation of binary information or bits, materialized in the form of separated magnetic domains, called bubbles in a bubble store. These domains have an opposite magnetization to that of the remainder of the magnetic material constituting the layer in which they are formed.

It is known that in a magnetic bubble store, each bubble can be displaced by a force. This movement can take place freely in any random direction in the plane of the magnetic layer. The magnetic layer is a magnetic garnet and the bubbles are formed in said layer by applying a d.c. magnetic field thereto perpendicular to the plane of the layer. This field is produced in practice by a permanent magnet and also ensures the non-volatility of the information contained in the store. The magnetic garnet in which the bubbles are formed is generally supported by an amagnetic monocrystalline garnet.

It is known to displace the bubbles by applying a rotary magnetic field, which is difficult to realise and whose function is to create poles, e.g. on permalloy patterns, which are in the form of T-bars, chevrons or semi-disks. In this way, shift registers are produced in which the binary information is represented by the presence 1 or the absence 0 of a bubble. Apart from these permalloy patterns, it is known that it is necessary to use electrical conductors for producing on the bubble store chip, writing, information recording, non-destructive reading, register-to-register transfer and erase functions. Erasing is carried out bit-by-bit by selective destruction of the bubbles, or in an overall total manner. This erasure can be obtained simply by increasing the value of the d.c. magnetic field to beyond the maximum value permitted for recording.

It is also known that a large number of known bubble stores have a magnetic garnet layer in which is effected an ion implantation around patterns corresponding to non-implanted zones of said garnet layer. As a result of their shape, these patterns constitute shift registers along which the bubbles cancirculate in the implanted zone. The magnetic bubbles are formed in the garnet layer, in the implanted portion thereof, on the peripheries of the non-implanted patterns. These patterns generally have an elongated shape and the reading or transfer of the content of the registers generally takes place by circulating the bubbles occurring at their ends towards another register or towards a reading station. This circulation of the bubbles at the ends of the registers is generally ensured by conductive sheets superimposed on the magnetic garnet layer at the ends of the registers and representing windows. These sheets are traversed by pulse-type currents supplying the bubbles which have reached the ends of the registers, either to another register, or to the reading station. This circulation is obtained by the appearance of positive and negative poles on the edges of the windows at the time when a current pulse is applied to the corresponding conductive sheet. Generally, these windows are arranged parallel to one another and perpendicular to a line corresponding to the direction along which the bubbles must travel. The passage of each bubble from the edge of one window to the edge of another window takes place in the magnetic garnet layer by attraction of said bubble as a result of appropriate polarities of the edges of the windows. This type of bubble circulation at the ends of registers of a bubble store is, for example, described in French patent application No. 8,008,765 on Apr. 18, 1980 in the name of the same Applicant.

A bubble store is also known in which the propagation of the bubbles is ensured by means of a device incorporating an electrically conductive sheet having windows, associated with non-implanted islands of the magnetic garnet layer. This type of propagation is described in the article by A. H. BOBECK entitled "Current access magnetic bubble circuits", Bell Laboratories, 600 Mountain Avenue, Murray Hill, N.J. "Bell System Technical Journal", Vol. 58, No. 6, July 1979.

In this type of propagation, as in that described in the aforementioned patent application, the magnetic bubbles are attached to or engaged on the border of the non-implanted island in the implanted region. During their displacements by a vertical field produced by a current in the sheet, the bubbles have to overcome the potential barrier at the border of said non-implanted patterns. A unidirectional, static plane field of 2100 Oersted (Oe) is applied in order to eliminate the "hard" bubbles. These hard bubbles are in fact bubbles having a reduced mobility and which have difficulty in following the direction imposed by the field.

A magnetic bubble store is also known in which the bubbles are propagated by a device incorporating an electrically conductive field having windows, as well as non-implanted patterns in the form of disks, of the magnetic garnet layer. This device is described in the article by H. OHTA entitled "Current Access Ion-Implanted Bubble Device Structure" corresponding to the lecture given by the author on Mar. 3, 1981 at the Atlanta International Conference on Magnetism and Magnetic Materials. In this type of device, when the ion implantation conditions are appropriate, there are charged walls at the edge of a non-implanted disk. The bubbles are propagated with the aid of vertical magnetic fields, which are produced by the charged walls linked with these patterns and by a hole in a current sheet. A rotary current applied to the sheet permits the displacement of the bubbles.

The propagation devices which use rotary fields are difficult to realise. The known devices using conductive sheets with windows associated with non-implanted islands and which use a vertical displacement field and a plane field for eliminating the hard bubbles, as well as the device using vertical fields and rotary currents, require a high power level for each propagation of an information bit.

SUMMARY OF THE INVENTION

The object of the invention is to obviate the disadvantages of propagation devices using conductive sheets with windows, associated with non-implanted patterns, particularly by reducing the propagation field of the bubbles, in order to reduce the dissipated power. These objects are achieved by using vertical components (perpendicular to the displacement of the bubbles) and planar components of the field used in the displacement of the bubbles, as a result of a careful combination of windows in the conductive layers associated with non-implanted patterns.

The invention therefore relates to a magnetic bubble store having at least one ion implantation magnetic garnet layer, in which are defined patterns corresponding to non-implanted zones of said garnet layers, magnetic bubbles being formable in the garnet layer, on the peripheries of the patterns and an electrically conductive layer superimposed on the garnet layer insulated therefrom and having windows for displacing each bubble from the periphery of one pattern to the periphery of another pattern, wherein the patterns are islands which are separated from one another, said electrically conductive layer having a first conductive coating insulated from the garnet layer by a first insulating layer, said first conductive coating having windows parallel to a first direction in order to respectively displace the bubbles existing between the patterns of the first pairs of patterns arranged parallel to said first direction, said first conductive coating receiving a pulse-type bubble displacement current parallel to the first direction and a second conductive coating superimposed on the first conductive coating and separated therefrom by a second insulating layer, said second conductive coating having windows parallel to a second direction for respectively displacing the bubbles present between the patterns of the second pairs of patterns arranged parallel to said second direction, said second conductive coating receiving a pulse-type bubble displacement current parallel to the second direction, each first pair having a common pattern with each second pair.

According to another feature of the invention, two consecutive windows have a common opening surface facing each common pattern.

According to another feature, the first and second directions are perpendicular.

According to another feature, the currents passing through the first and second conductive coatings have an intensity such that the components of the magnetic field perpendicular to the edge of the windows, produced by these currents, produce magnetic forces which exceed the coercivity of the bubbles.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
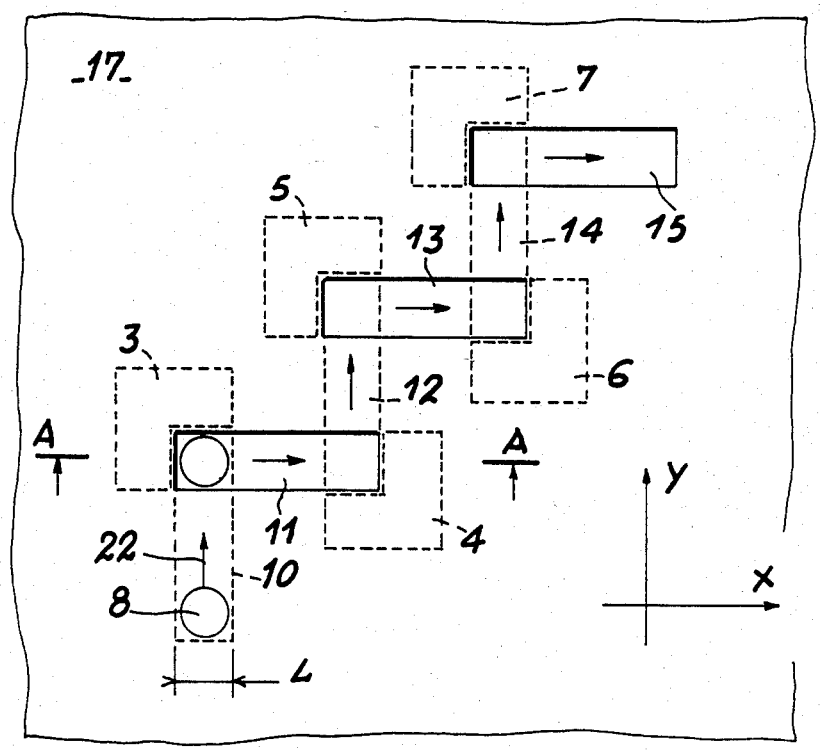
FIG. 1 diagrammatically, a plan view of a magnetic bubble propagation device according to the invention.
Figure 2:
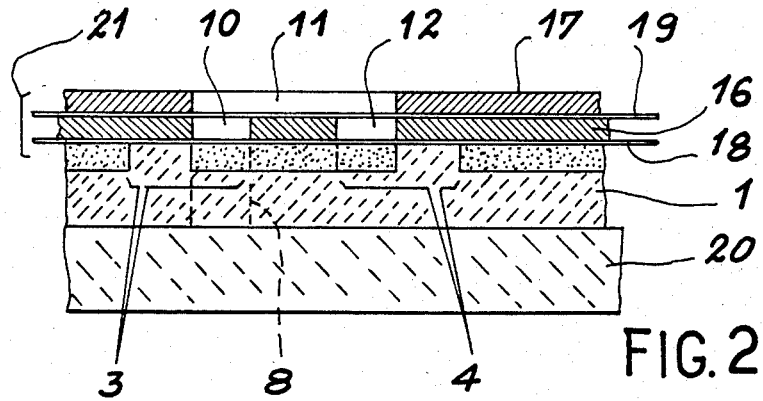
FIG. 2 section A of the device of FIG. 1.

FIGS. 1 and 2 diagrammatically show a plan view and a sectional view A of the magnetic bubble propagation device according to the invention. This device has at least one magnetic garnet layer 1, which can e.g. be constituted by a material of formula $(YSmCuCa)_3(FeGe)_5O_{12}$. The magnetic garnet layer 1 undergoes ion implantation, as well as thermal annealing. This implantation consists of implanting $Ne^+$ ions in the garnet layer, e.g. under the action of an electrical field. Thus, for example, the density of these ions is $2 \times 10^{14}$ $Ne^+$ ions/cm$^2$ and the electrical field applied during this implantation can be 200 KeV. The thermal annealing of the magnetic garnet layer can be carried out at 700° C. Layer 1 has patterns 3, 4, 5, 6, 7, etc corresponding to non-implanted zones of the garnet. Magnetic bubbles 8 are formed in the implanted zone of the magnetic garnet layer and they circulate in the manner to be described hereinafter on the peripheries of the non-implanted patterns 3, 4, 5, 6, 7, as well as in the windows 10, 12, 14 and 11, 13, 15 respectively cut from a first conductive coating 16 and from a second conductive coating 17. The first conductive coating 16 is superimposed on the magnetic garnet layer 1 and is separated therefrom by a first layer 18 made from an electrically insulating material. The second conductive coating 17 is superimposed on the first coating and is separated therefrom by a second layer 19 of an electrically insulating material. The windows 10, 11, 12 of FIG. 1 can also be seen in FIG. 2. The garnet layer 1 can be supported by an amagnetic substrate 20 e.g. of formula $Ge_3Ga_5O_{12}$. The electrically conductive coatings 16, 17 form an electrically conductive layer 21 perforated by windows 10, 11 ... 15. These windows make it possible to displace each bubble from the periphery of one pattern to the periphery of another pattern. The patterns 3, 4 ... 7 form islands which are separated from one another in the magnetic garnet layer 1. The magnetic bubbles 8 are displaced, in the manner to be shown hereinafter, e.g. in the direction of arrows 22 by means of pulse-type electric currents respectively applied to the first and second conductive coatings 16, 17. The first current pulse applied e.g. to the first conductive coating 16 makes it possible to displace bubble 8 in the direction of the periphery of the non-implanted pattern 3. The first current pulse applied to the second conductive coating 17 will displace said bubble in the direction of the periphery of pattern 4. The same applies regarding the displacement of this bubble towards the peripheries of the other patterns shown in FIG. 1.

Windows 10, 12, 14, etc of the first conductive coating 16 are parallel to a first direction Y and make it possible to respectively displace the existing bubbles between the patterns of the first pairs of patterns such as 4, 5 and 6, 7. The windows such as 11 and 13 are parallel to a second direction, e.g. X and make it possible to displace the existing bubbles between second pairs of patterns such as 3, 4 and 5, 6. These second pairs of patterns are positioned parallel to a second direction X.

According to the invention, two consecutive windows such as e.g. 10, 11 have a common opening surface facing the corresponding common pattern 3. Preferably, the first and second directions Y and X are perpendicular.

As will be shown hereinafter, the pulse-type currents passing through the first and second conductive coatings 16, 17 have an intensity such that the components of the magnetic field perpendicular to the edges of the windows, produced by these currents, produce magnetic forces which are higher than the coercivity of the bubbles.

Figure 3A:
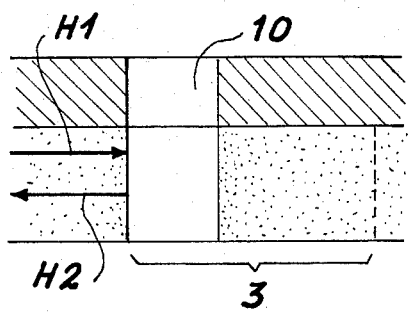
FIG. 3a a parallel sectional view of the device showing the two directions of the components of the plane field.
Figure 3B:
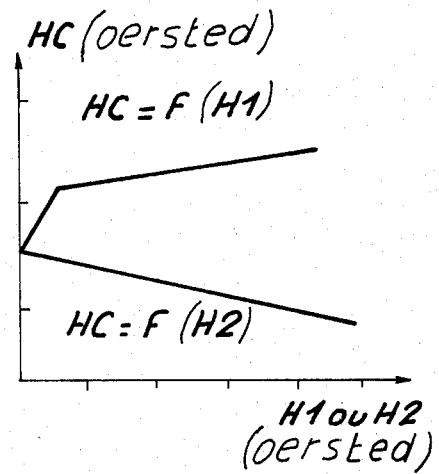
FIG. 3b a graph showing the variation of the bubble collapse field as a function of the amplitude of the plane field applied.

FIGS. 3a and 3b give a better understanding of the operation of the device according to the invention. FIG. 3a diagrammatically shows components $H_1$ or $H_2$ of the plane magnetic field perpendicular to the periphery of a non-implanted pattern 3 and produced e.g. by the passage of a current pulse in conductive coating 16. This plane field can have one of the two directions $H_1$ or $H_2$ and is perpendicular to the edge of e.g. window 10.

FIG. 3b is a graph showing the variation of the amplitude of the collapse field HC (or bubble disappearance field), as a function of the amplitude and direction of the plane field $H_1$ or $H_2$ and in this graph the fields are given in Oersteds.

When the plane field is applied perpendicular to the border of a rectilinear, non-implanted pattern, magnetic charges are developed along the border of this pattern and they modify the properties of the bubbles. These magnetic charges give rise to the appearance of a vertical leakage current, which can modify the collapse or disappearance field of the bubbles located along the border of the pattern, as well as the gradients of the potential barrier on said border. Thus, as a function of the direction of the plane field, there is an increase or decrease in the collapse field, as well as an attracting or repelling effect on each bubble positioned along said pattern border.

Figure 4A:
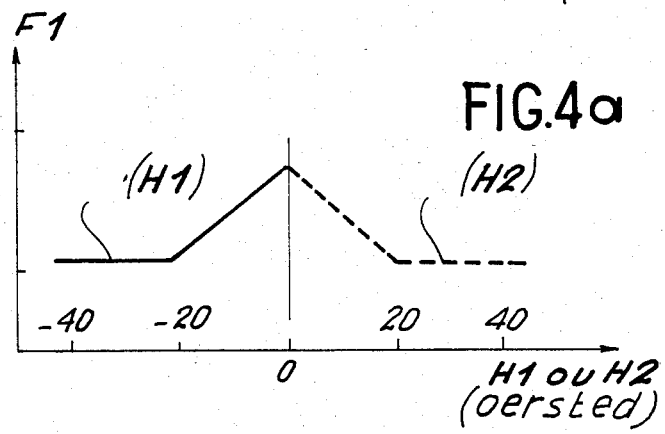
FIG. 4a a graph showing the variation of the bubble transfer force, as a function of the amplitude of the plane field.
Figure 4B:
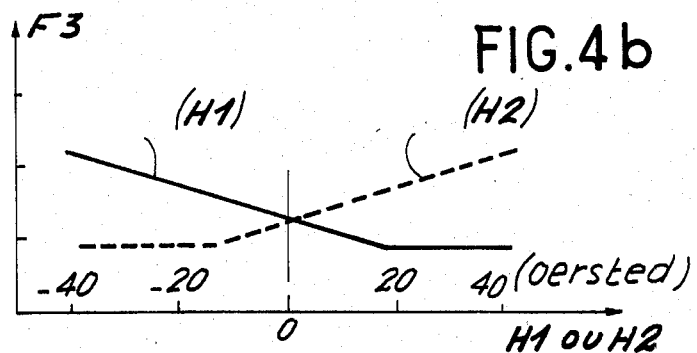
FIG. 4b a graph showing the variation of the bubble attachment or engagement force, as a function of the amplitude of the plane field.

FIG. 4b is a graph showing the transfer force $F_1$ of a bubble, as a function of the amplitude and the direction of the plane field applied perpendicular to the border of a non-implanted pattern. The continuous line therein represents the transfer force $F_1$ for the plane field $H_1$, whilst said transfer force is indicated by broken lines for the plane field $H_2$, whose direction is opposite to $H_1$.

FIG. 4b shows the variations in the attachment or attraction force $F_3$ of a bubble, as a function of the amplitude of the plane field and the direction of said field. This force is represented by continuous lines for the plane field of direction $H_1$ and in the form of broken lines for the plane field of direction $H_1$. The plane field in this graph, as well as in the graph of FIG. 4a is expressed in Oersted.

These graphs show that when repulsive charges appear (at approximately 20 Oe in the considered example), the attachment force $F_3$ of a bubble on the border of an implanted pattern decreases with the amplitude of the plane field applied. The transfer force $F_1$ also decreases with the amplitude of the plane field applied.

Figure 5A:
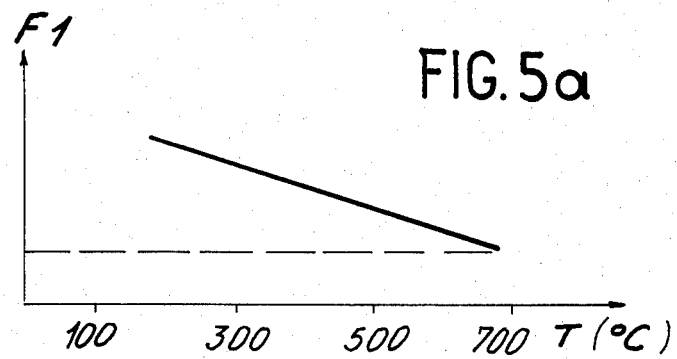
FIGS. 5a and 5b, graphs respectively showing the variations of the transfer force and the attachment force of the bubbles, as a function of the temperature of the magnetic garnet layer.
Figure 5B:
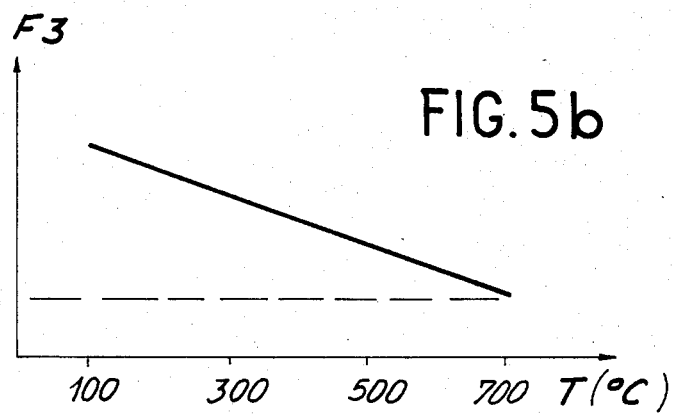

FIGS. 5a and 5b are graphs respectively showing the variations of the transfer force $F_1$ and the attachment force $F_3$, as a function of the thermal annealing temperature of the magnetic garnet field. The broken lines in the graph represent the coercivity, i.e. the minimum mechanical force (friction) necessary for displacing the bubble when applied thereto. The annealing temperatures T are expressed in °C. The attachment force $F_3$, as well as the contribution of the magnetic charges to this force, are dependent on the ion implantation and thermal annealing conditions. The thermal annealing has the effect of reducing the attachment forces exerted on the bubbles. In the magnetic garnet chosen in exemplified manner and which is implanted in the presence of an electrical field of 200 KeV and for annealing performed at 700° C., the attachment force is equal to the coercivity in a uniformly implanted region. This force, expressed in magnetic field unity, is approximately 3.5 Oe for a plane field of 25 Oe applied perpendicular to the border of the non-implanted pattern. Under these conditions, the contributions of the magnetic charges to the attachment force $F_3$ is approximately 2.5 Oe. When the magnetic charges are repulsive, the attachment force is approximately $3.5-2.5=1$ Oe. The bubble propagation field is then lower than that of the coercivity.

In the device described in exemplified manner hereinbefore, the bubbles have a diameter of approximately $2\mu$. The non-implanted patterns are obtained by masking using a gold coating and thermal annealing is carried out at approximately 700° C. for 2 hours. The conductive coatings to which the pulses are applied to enable the bubbles to circulate are made from gold, whilst the electrically insulating layers have a thickness of approximately 1500 Å.

A bubble is propagated by a current pulse in the conductive coating 16, followed by a current pulse in conductive coating 17 and so on as a function of the pattern to which it is wished to direct said bubble.

Figure 6:
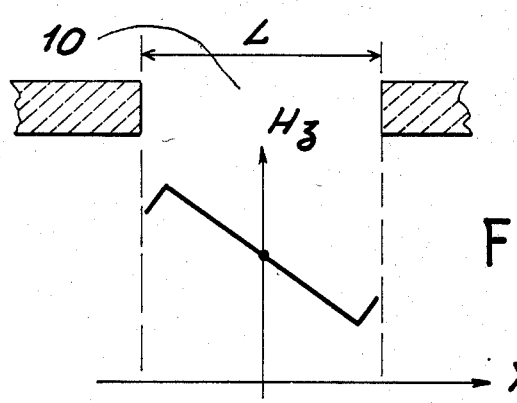
FIG. 6 the variation of the vertical magnetic field facing a window of one of the conductive coatings.

FIG. 6 shows the variation of the vertical magnetic field Hz facing one of the windows 10, e.g. of width L. When the vertical magnetic field Hz has a maximum value, there are repulsive magnetic charges on the borders of the corresponding non-implanted pattern, whilst when the vertical magnetic field Hz has a minimum value, attractive magnetic charges are present on the border of said pattern. The appearance of these attractive charges reduces the propagation field of the bubble.

The value of the vertical magnetic field can be easily calculated on the basis of the value of the plane component of the field described hereinbefore. This plane component is equal to $2\pi \times J$ (J being the linear current density in the considered conductive coating).

The main advantages of the device according to the invention are that it makes it possible to reduce the bubble propagation field and consequently the power dissipated in the conductive coatings controlling said propagation. It makes it possible to eliminate hard bubbles, because all the bubbles are propagated in an implanted zone of the magnetic garnet. Finally, the bubbles have a stable equilibrium position when stopped and they are trapped on the borders of the implanted patterns.

What is claimed is:

1. A magnetic bubble store having at least one ion implantation magnetic garnet layer, in which are defined patterns corresponding to non-implanted zones of said garnet layer, magnetic bubbles being formable in the garnet layer, on the peripheries of the patterns and an electrically conductive layer superimposed on the garnet layer insulated therefrom and having windows for displacing each bubble from the periphery of one pattern to the periphery of another pattern, wherein the patterns are islands which are separated from one another, said electrically conductive layer having a first conductive coating insulated from the garnet layer by a first insulating layer, said first conductive coating having windows parallel to a first direction in order to respectively displace the bubbles existing between the patterns of the first pairs of patterns arranged parallel to said first direction, said first conductive coating receiving a pulse-type bubble displacement current parallel to the first direction and a second conductive coating superimposed on the first conductive coating and separated therefrom by a second insulating layer, said second conductive coating having windows parallel to a second direction for respectively displacing the bubbles present between the patterns of the second pairs of patterns arranged parallel to said second direction, said second conductive coating receiving a pulse-type bubble displacement current parallel to the second direction, each first pair having a common pattern with each second pair.

2. A device according to claim 1, wherein two consecutive windows have a common opening surface facing each common pattern.

3. A device according to claim 1, wherein the first and second directions are perpendicular.

4. A device according to claim 3, wherein the currents passing through the first and second conductive coatings have an intensity such that the components of the magnetic field, perpendicular to the edge of the windows, produced by these currents, produce magnetic forces higher than the coercivity of the bubbles.

* * * * *